US006245602B1

(12) United States Patent
Ho et al.

(10) Patent No.: US 6,245,602 B1
(45) Date of Patent: Jun. 12, 2001

(54) TOP GATE SELF-ALIGNED POLYSILICON TFT AND A METHOD FOR ITS PRODUCTION

(75) Inventors: Jackson Ho, Palo Alto; Ronald T. Fulks, Mountain View, both of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/442,407

(22) Filed: Nov. 18, 1999

(51) Int. Cl.$^7$ ..................................... H01L 21/84
(52) U.S. Cl. .................... 438/158; 438/160; 438/571; 438/486
(58) Field of Search .................. 438/158, 160, 438/949, 950, 486, 161, 162, 159, 571, 175, 166; 257/66, 59, 69, 72, 285, 286, 287, 347, 506

(56) References Cited

U.S. PATENT DOCUMENTS

| | | | |
|---|---|---|---|
| 4,692,994 | * | 9/1987 | Moniwa et al. ................. 437/40 |
| 4,811,076 | * | 3/1989 | Tigelaar ......................... 357/51 |
| 4,811,078 | * | 3/1989 | Tigelaar et al. ................ 357/54 |
| 4,894,693 | * | 1/1990 | Tigelaar et al. ............. 357/23.6 |
| 5,733,804 | * | 3/1998 | Hack et al. .................. 438/158 |
| 5,894,137 | * | 4/1999 | Yamazaki et al. ............ 257/66 |

\* cited by examiner

*Primary Examiner*—Charles Bowers
*Assistant Examiner*—Laura M Schillinger
(74) *Attorney, Agent, or Firm*—Finnegan, Henderson, Farabow, Garrett, & Dunner, LLP

(57) ABSTRACT

A top gate, self-aligned polysilicon (poly-Si) thin film transistor (TFT) is formed using a single laser anneal to crystallize the active silicon and to activate the source-drain region. The poly-Si TFT includes a substrate, dummy gate, a barrier oxide layer, a polysilicon pattern having a source region and a drain region, a gate oxide, and a gate.

6 Claims, 4 Drawing Sheets

TOP GATE SELF-ALIGNED POLYSILICON TFT AND A METHOD FOR ITS PRODUCTION

FIELD OF THE INVENTION

The present invention relates generally to a self-aligned polysilicon thin film transistor and its method of fabrication, and more particularly a top gate self-aligned polysilicon thin film transistor using a dummy gate and its method of fabrication.

BACKGROUND OF THE INVENTION

In current active matrix liquid crystal display (LCD) technology, each pixel is addressed by a transistor fabricated on a transparent glass substrate. This thin film transistor (TFT) serves as a switch controlling the charging and discharging of a liquid crystal cell to determine the amount of light transmitted. Conventional TFTs are either amorphous silicon (a-Si) or polysilicon (poly-Si). Currently, a-Si TFTs are the dominant technology used for active matrix liquid crystal displays. Poly-Si TFTs, however, offer several advantages over a-Si technology. First, poly-Si TFTs displays are less costly, since its driver circuits can be formed at the same time on the same substrate as the panel. Second, poly-Si can provide higher aperture ratio displays at high pixel densities. Third, the carrier mobility of poly-Si TFTs are, at the present time, more than 200 times that of a-Si TFTs. And since poly-Si TFTs operate at higher speeds and frequencies, additional circuits can be fabricated on the periphery of the display reducing production yield problems and lowering the cost of the display. Another advantage of poly-Si technology is reduced TFT size which allows the light blocking areas of the display to be minimized resulting in higher brightness and resolution.

A conventional top gate self-aligned poly-Si TFT is shown in FIG. 1. A layer of active silicon is deposited onto a fused quartz substrate (101) by, for example, low-pressure chemical vapor deposition (LPCVD). This layer is then annealed at a temperature of 600° C. for four hours in a nitrogen atmosphere to cause the amorphous silicon to crystallize into polysilicon (102).

The polycrystalline silicon layer is then patterned into an island. A gate oxide layer (103) is then deposited over the polysilicon layer and a polysilicon layer or metal layer of, for example chromium, is deposited over the gate oxide layer, patterned, and etched to form a gate (104). Ion implantation is used to cause dopants such as phosphorous ions to penetrate the oxide layer (103) and settle into the polysilicon (102), except where the dopants are blocked by the gate (104). This forms N+type source and drain regions in the polycrystalline silicon layer. A dielectric layer (105) of low temperature silicon oxide (LTO) is then deposited by LPCVD. The structure is then annealed again to activate the source and drain regions. In the resultant structure, source and drain regions (107) and (108) become heavily doped polysilicon while channel region (109) remains undoped and exactly aligned with the gate.

To complete the top gate poly-Si TFT via holes are etched through the LTO layer (105) and the gate oxide layer (103) down to the source/drain regions, filled with conductive plugs (106), and connected to other parts of the circuit (not shown). Finally, a hydrogen passivation is carried out for about 8 hours in a parallel-plate plasma reactor at a substrate temperature of 350° C. in an $H_2$ and Ar gas mixture at a power density of 0.21 W/$Cm^2$ and a frequency of 30 kHz. This allows hydrogen atoms to diffuse through the LTO (105) layer to reach the channel region of the polysilicon.

This prior art method, however, suffers several limitations. Ion implantation damages the silicon layer and it must be regrown using a higher anneal temperature that may not be compatible with low temperature glass substrates that are desirable because of lower cost. Furthermore, the long hydrogenation step adds cost and time to the process.

U.S. Pat. No. 5,602,047 (the '047 patent) discloses a method for making a bottom gate TFT using an excimer laser that simultaneously crystallizes the active silicon and activates the source-drain region. The TFT disclosed in the '047 patent, however, is a "bottom gate" structure. In contrast to the "top gate" structure previously described in which the gate electrode and oxide layer reside over the channel region, a "bottom gate" TFT has a gate electrode and oxide layer under the channel region. Bottom gate structures typically use a metal gate of aluminum, tantalum, chromium or molybdenum. Top gate structures are generally preferred over bottom gate structures which suffer performance problems because the highest quality (the top) portion of the active layer is not against the gate dielectric. Additionally, the use of a metal gate can cause problems due to the differences in the coefficient of thermal expansion such as cracking at the interface where laser light is reflected by the metal gate and absorbed by the substrate.

In light of the foregoing, there is a need for a method to make self-aligned top gate poly-Si TFTs that allows the use of low temperature substrates and requires only a single laser anneal to activate the source-drain region and to crystallize the active silicon.

SUMMARY OF THE INVENTION

Accordingly, the present invention is directed to a method of making a self-aligned polysilicon thin film transistor. The method includes the steps of providing a substrate that is optically transparent with a top surface, depositing a dummy gate on the top surface of the substrate, and depositing an isolation oxide layer. Next, an active silicon layer is deposited over the isolation oxide, a mask layer is deposited over the active silicon layer, and the mask layer is exposed to radiation directed to pass first through the bottom surface where the dummy gate acts as an optical mask. The mask layer is then developed to form a mask in exact alignment with the dummy gate. Dopant material is implanted to form a source-drain region, the mask is removed, and laser annealing to crystallize the active layer into polysilicon and to activate the source-drain regions. A gate oxide layer is then deposited over the polysilicon layer and an n+gate is deposited over the gate oxide layer. A photoresist layer is deposited and exposed to radiation directed to pass first through the bottom surface where the dummy gate acts as an optical mask. The photoresist layer is developed to form a photoresist mask to define the gate, a first passivation layer is deposited, and contact openings made. Finally, a metal layer is deposited on the polysilicon to contact the source-drain region, patterned, and etched so it does not overlap the gate oxide. The metal layer and polysilicon are coated with a second passivation layer. Bond pads are then etched and formed through the passivation layer to the metal layer.

In another aspect, the invention is directed to a self-aligned polysilicon thin film transistor comprising an optically transparent substrate, a dummy gate, an isolation oxide layer, a doped polysilicon layer having a doped source, a doped drain, and an undoped channel, a gate oxide layer; and a self-aligned conductive gate.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and together with the description serve to explain the principles of the invention.

BRIEF DESCRIPTION OF THE DRAWINGS

The accompanying drawings, which are incorporated in and constitute a part of this specification, illustrate an embodiment of the invention and, together with the description, serve to explain the objects, advantages, and principles of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
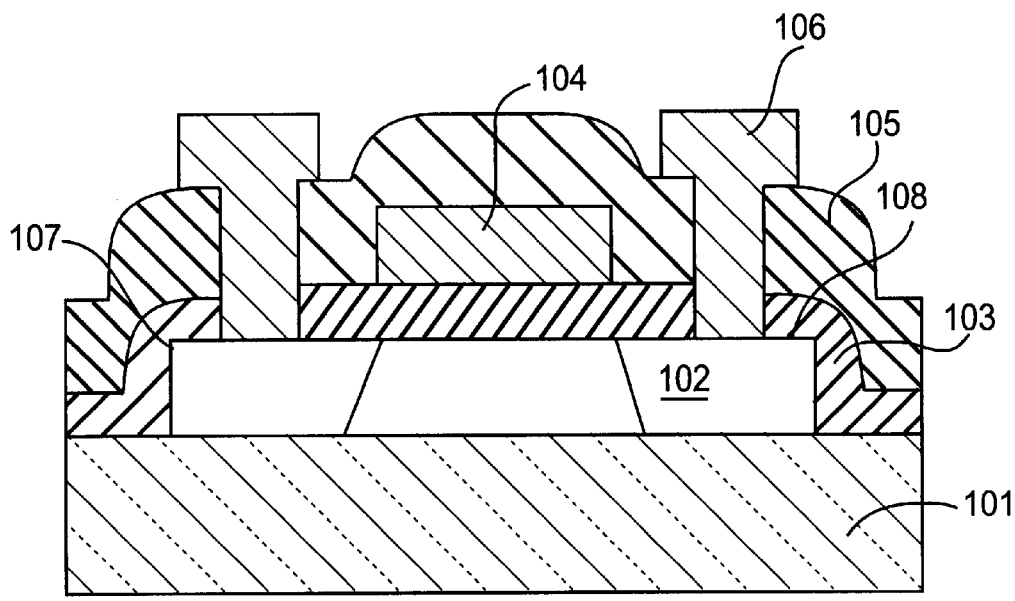
FIG. 1 is a cross-sectional view that illustrates a prior art top gate TFT.
Figure 2A:
FIG. 2a is a cross-sectional view that schematically illustrates the step of depositing and patterning the dummy gate.
Figure 2B:
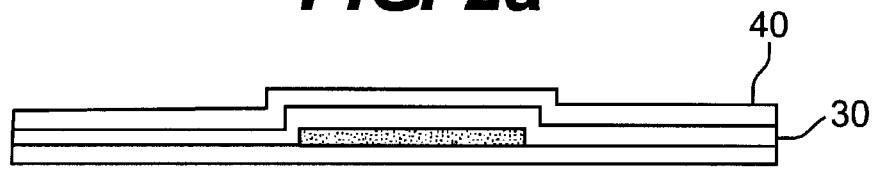
FIG. 2b is a cross-sectional view that schematically illustrates the step of depositing the isolation oxide layer and the active silicon.

FIGS. 2a–e illustrate the method of making a self-aligned poly-Si TFT according to one aspect of the present invention. FIG. 2a schematically illustrates the step of forming a dummy gate (20) on a substrate (10) and patterning using photolithography processes known in the art. The substrate (10) is preferably glass, but may be any transparent or semi-transparent material. The dummy gate (20) is then formed by depositing the dummy gate material onto the substrate and patterning to form a dummy gate (20). The dummy gate material may be any material that blocks ultraviolet light, for example, silicon, metal, or rugate filters. The thickness of the gate depends on the material chosen, but should at a minimum be thick enough to block ultraviolet light. An oxide may optionally be deposited onto the substrate (10) prior to depositing the dummy gate (20) in order to form a buffer layer for additional isolation of the device from possible substrate contamination An oxide layer (30) is then deposited over the dummy gate and the portion of the substrate not covered by the dummy gate. This is shown in FIG. 2b. The oxide layer serves to thermally isolate the dummy gate structure from the damaging effects of laser annealing. The oxide layer material can be any transparent dielectric material. It can be deposited by conventional means such as plasma CVD, sputtering, or low temperature CVD to a thickness of about 300–1000 nm and, preferably, to thickness of about 700 nm.

Figure 2C:
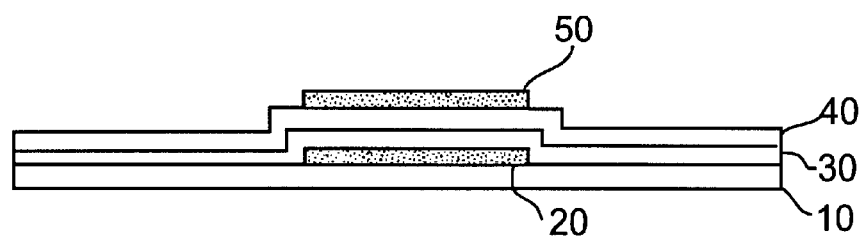
FIG. 2c is a cross-sectional view that schematically illustrates the step of depositing the photoresist, backside exposing and ion implantation.

An active silicon layer (40) is then deposited using conventional means over the isolation oxide to thickness of about 50–100 nm. A mask layer is then deposited over the silicon layer. The mask layer can be, for example, photoresist that is patterned by exposure to light through the substrate. During this backside exposure, the dummy gate acts as an optical mask. The photoresist is then developed to form a mask (50) in exact alignment with the dummy gate as shown in FIG. 2c. The source-drain region is then formed by ion implantation.

For a CMOS process, a dielectric layer of silicon nitride or silicon oxide can be used as the mask layer. Two additional masking steps using photoresist are then required to form n-channel and p-channel devices using ion implantation of phosphorus and boron, respectively.

Figure 2D:
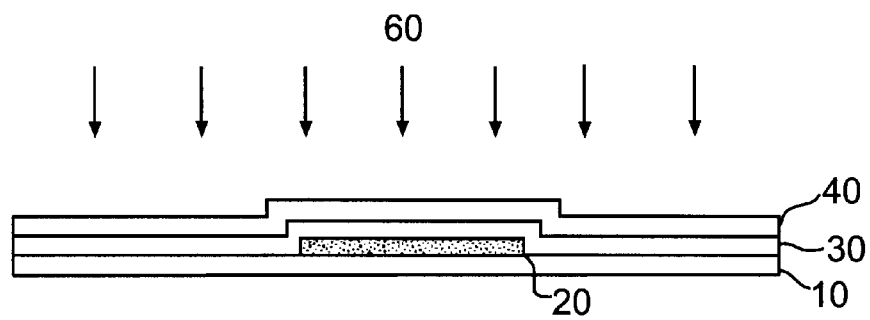
FIG. 2d is a cross-sectional view that schematically illustrates the step of laser crystallizing the active layer and the source and drain region.

Next, the mask is removed and the structure is laser annealed to simultaneously crystallize the active silicon into polysilicon and activate the dopants in the source-drain region. This is schematically shown in FIG. 2d where arrows (60) represent the laser pulses.

One advantage of the present invention is that hydrogenation can be performed at this point in the process. Since the silicon layer is exposed, hydrogenation times are shorter and temperatures lower. Hydrogenation may be carried out by techniques known in the art.

Figure 2E:
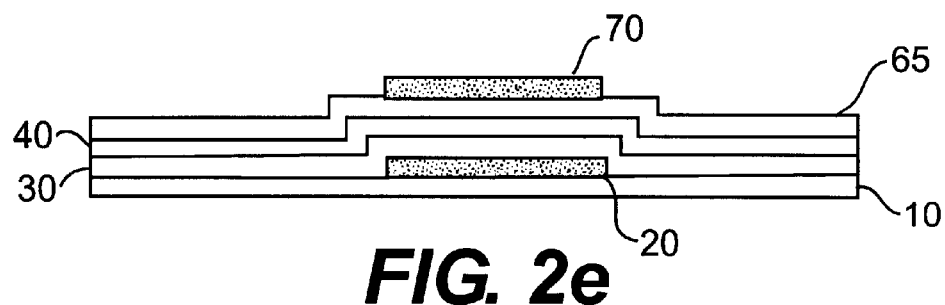
FIG. 2e is a cross-sectional view that schematically illustrates the step of depositing the gate oxide, the N+gate, the photoresist, backside exposing and etching to form the gate.

The remaining steps of the process are accomplished by conventional means. First, the polycrystalline silicon is patterned into islands. Then, as shown in FIG. 2e, a gate oxide layer (65) is deposited by plasma CVD, LPCVD, or sputtering. A gate (70) is then formed of any conductive, transparent material. Examples of gate material include doped silicon, either n+or p+, and ITO. A photoresist layer is then deposited, exposed to radiation by backside exposure, and etched to form the gate (70). The dummy gate again acts as an optical mask.

Figure 3:
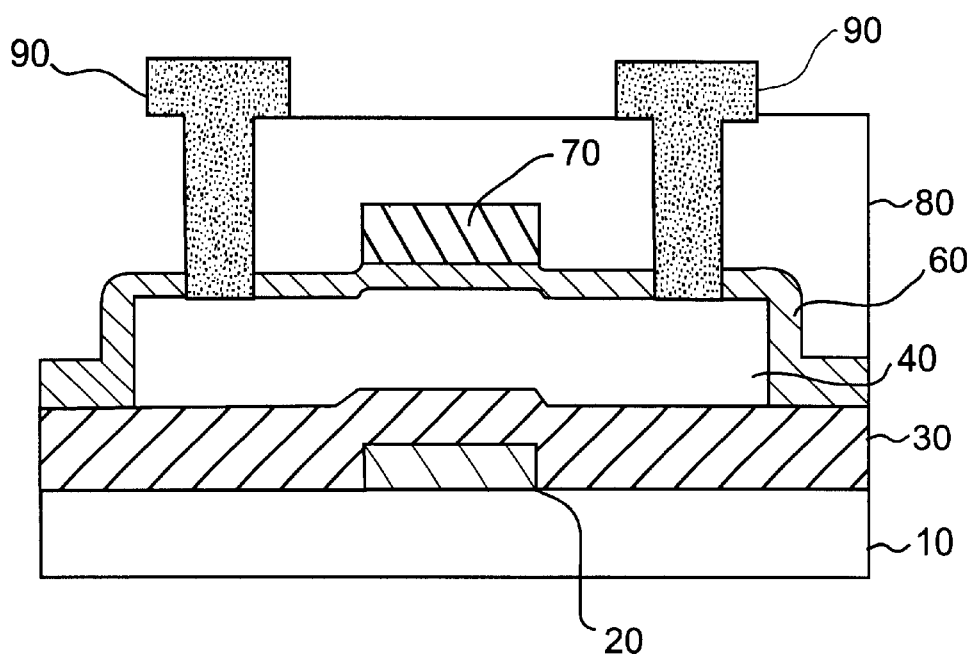
FIG. 3 is a cross-sectional view that schematically illustrates a top gate self-aligned TFT according to one embodiment of the present invention.

Finally, as shown in the device seen in cross section in FIG. 3, a first passivation layer (80) is deposited, contact openings formed, and a metal layer deposited. The metal layer is patterned and etched to form local and global interconnects (90). A second passivation layer (not shown) can then be deposited and etched to expose bond pads through the second passivation layer to metal layer.

Figure 4:
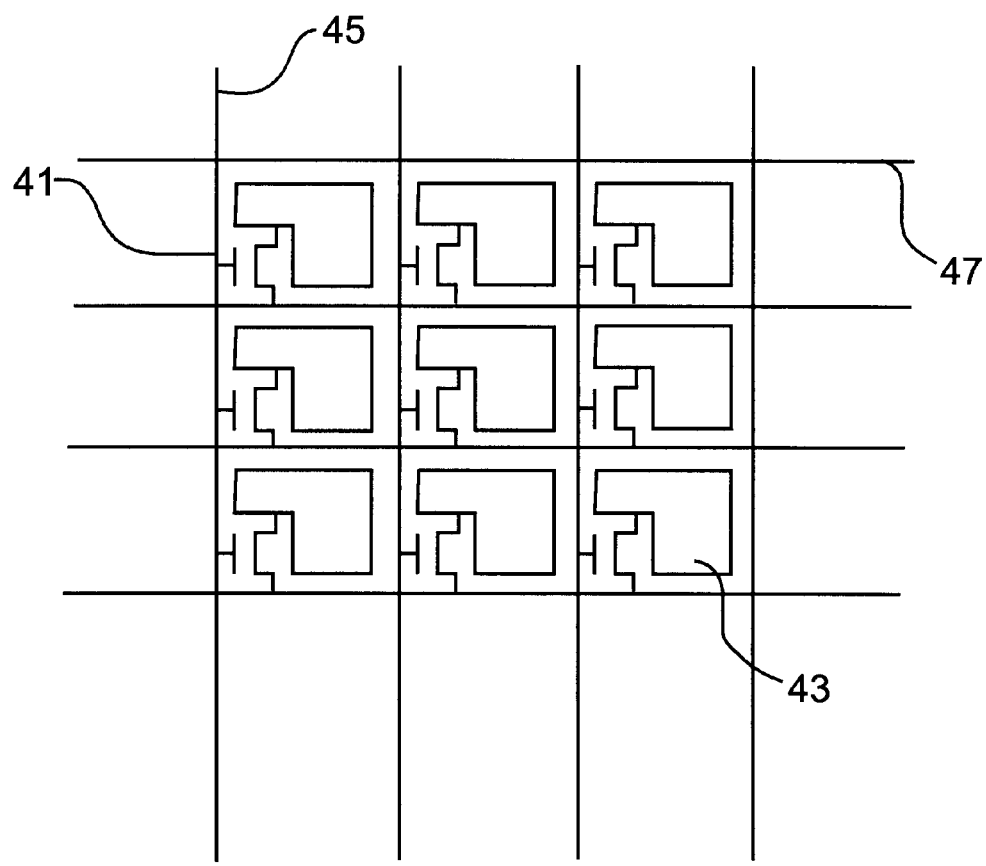
FIG. 4 is a schematic illustration of an array of top gate self-aligned TFTs according to another embodiment of the present invention.

Another embodiment consistent with the present invention is an array (40) of top gate, self-aligned TFTs. As shown in FIG. 4, the TFTs (41) are arranged in rows and columns. Array (40) further includes a plurality of pixels (43), where each pixel is addressed by a TFT (41). Array (40) also includes scan lines (45) and data lines (47). Scan lines (45) and data lines (47) are typically disposed in the array substantially perpendicular to each other in a matrix arrangement. Scan lines (45) are coupled to the gate electrodes of a row (or alternatively a column) of TFTs (41) and the signals on these lines are used to cause TFT (41) to become conductive or non-conductive. The data lines (47) are coupled to the drains of a column (or alternatively a row) of TFTs (41).

It will be apparent to those skilled in the art that various modifications and variations can be made in the top gate, self-aligned TFT and in the process of manufacturing the present invention without departing from the spirit or scope of the invention. Thus, it is intended that the present invention cover the modifications and variations of this invention provided they come within the scope of the appended claims and their equivalents.

What is claimed is:

1. A method of making a top gate, self-aligned polysilicon thin film transistor comprising the steps of
   depositing a dummy gate on an optically transparent substrate;
   depositing an isolation oxide layer over the dummy gate and the substrate;
   depositing an active silicon layer over the isolation oxide layer;
   depositing a mask layer over the active silicon layer and patterning the mask layer by backside exposure wherein the dummy gate acts as an optical mask;
   ion implanting dopant material to form a source-drain region;
   laser annealing to simultaneously crystallize the active layer into polysilicon and to activate the source-drain region;
   depositing a gate oxide layer over the polysilicon layer;
   depositing a transparent conductive gate over the gate oxide layer; and
   depositing a photoresist layer and patterning the photoresist layer by backside exposure wherein the dummy gate acts as an optical mask.

2. The method of making a self-aligned polysilicon thin film transistor according to claim 1, wherein the method is incorporated into a CMOS process and wherein the step of depositing a mask layer further comprises the steps of:
   depositing and patterning a first dielectric mask layer comprising silicon nitride or silicon oxide;
   depositing and patterning a second mask layer;
   ion implanting to form N-type impurity regions and P-type impurity regions.

3. The method of making a self-aligned polysilicon thin film transistor according to claim 1, wherein the dummy gate has a thickness sufficient to block ultraviolet light.

4. The method of making a self-aligned polysilicon thin film transistor according to claim 1, wherein the isolation oxide layer is deposited to a thickness of 300–1000 nm and comprises a dielectric material.

5. The method of making a self-aligned polysilicon thin film transistor according to claim 1, wherein the active silicon layer is deposited to a thickness of about 50–100 nm.

6. The method of making a self-aligned polysilicon thin film transistor according to claim 1, wherein the method further includes a step of hydrogentation as the step immediately following laser annealling.

* * * * *